United States Patent
Vela Becerra et al.

(10) Patent No.: US 9,834,856 B2
(45) Date of Patent: Dec. 5, 2017

(54) CONTROLLED FABRICATION OF SEMICONDUCTOR-METAL HYBRID NANO-HETEROSTRUCTURES VIA SITE-SELECTIVE METAL PHOTODEPOSITION

(71) Applicants: Javier Vela Becerra, Ames, IA (US); T. Purnima A. Ruberu, Ames, IA (US)

(72) Inventors: Javier Vela Becerra, Ames, IA (US); T. Purnima A. Ruberu, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 1135 days.

(21) Appl. No.: 13/733,975

(22) Filed: Jan. 4, 2013

(65) Prior Publication Data

US 2013/0174778 A1    Jul. 11, 2013

Related U.S. Application Data

(60) Provisional application No. 61/584,059, filed on Jan. 6, 2012, provisional application No. 61/596,447, filed on Feb. 8, 2012.

(51) Int. Cl.
| | | |
|---|---|---|
| *C30B 7/14* | (2006.01) | |
| *C30B 7/00* | (2006.01) | |
| *C30B 29/02* | (2006.01) | |
| *C30B 29/50* | (2006.01) | |
| *C30B 29/60* | (2006.01) | |

(52) U.S. Cl.
CPC ............... *C30B 7/14* (2013.01); *C30B 7/005* (2013.01); *C30B 29/02* (2013.01); *C30B 29/50* (2013.01); *C30B 29/60* (2013.01)

(58) Field of Classification Search
CPC .. C30B 7/00; C30B 7/14; C30B 29/62; C30B 30/00; Y10S 977/70; Y10S 977/762; Y10S 977/773; Y10S 977/81; Y10S 977/824
USPC .............. 117/11, 68–69, 902, 921, 937, 958; 977/840, 890, 892, 895–896, 901
See application file for complete search history.

(56) References Cited

U.S. PATENT DOCUMENTS

| | | | |
|---|---|---|---|
| 2006/0014981 A1* | 1/2006 | Reetz et al. | 564/13 |
| 2006/0110279 A1* | 5/2006 | Han et al. | 420/523 |
| 2009/0220792 A1* | 9/2009 | Ying et al. | 428/403 |

OTHER PUBLICATIONS

G. Dukovic, et al. publication entitled "Photodeposition of Pt on colloidal CdS and CdSe/CdS semiconductor nanostructures," Advanced Materials, vol. 20, pp. 4306-4311 (2008).*

(Continued)

*Primary Examiner* — Kenneth A Bratland, Jr.
(74) *Attorney, Agent, or Firm* — Reinhart Boerner Van Deuren P.C.

(57) ABSTRACT

A method of synthesizing colloidal semiconductor-metal hybrid heterostructures is disclosed. The method includes dissolving semiconductor nanorods in a solvent to form a nanorod solution, and adding a precursor solution to the nanorod solution. The precursor solution contains a metal. The method further includes illuminating the combined precursor and nanorod solutions with light of a specific wavelength. The illumination causes the deposition of the metal in the precursor solution onto the surface of the semiconductor nanorods.

17 Claims, 4 Drawing Sheets

(56) References Cited

OTHER PUBLICATIONS

Y. Shemesh, et al. publication entitled "Synthesis and photocatalytic properties of a family of CdS-PdX hybrid nanoparticles," Angewandte Chemie, vol. 50, pp. 1185-1189 (2011).*

Gordana Dukovic et al.; Photodeposition of Pt on Colloidal CdS and CdSe/CdS Semiconductor Nanostructures; Advanced Materials; Aug. 6, 2008; 12 pages.

Aleksandar Vaneski et al.; Hybrid Colloidal Heterostructures of Anisotropic Semiconductor Nanocrystals Decorated with Noble Metals: Synthesis and Function; Advanced Functional Materials; 2011; 10 pages (1547-1556); vol. 21.

Pantaleo Davide Cozzoli et al.; Synthesis, Properties and Perspectives of Hybrid Nanocrystal Structures; Chemical Society Reviews; 2006; 14 pages (1195-1208) vol. 35.

Ronny Costi et al.; Colloidal Hybrid Nanostructures: A New Type of Functional Materials; Angew. Chem. Int. Ed.; 2010; 20 pages (4878-4897); vol. 49.

* cited by examiner

CONTROLLED FABRICATION OF SEMICONDUCTOR-METAL HYBRID NANO-HETEROSTRUCTURES VIA SITE-SELECTIVE METAL PHOTODEPOSITION

CROSS-REFERENCE TO RELATED PATENT APPLICATIONS

This patent application claims the benefit of U.S. Provisional Patent Application No. 61/584,059 filed Jan. 6, 2012, and 61/596,447 filed Feb. 8, 2012, the entire teachings and disclosures of which are incorporated herein by reference thereto.

STATEMENT REGARDING FEDERALLY SPONSORED RESEARCH AND DEVELOPMENT

This invention was made in part with Government support under Grant Number DE-AC02-07CH11358 awarded by the U.S. Department of Energy. The Government has certain rights in this invention.

FIELD OF THE INVENTION

This invention generally relates to semiconductor-metal hybrids.

BACKGROUND OF THE INVENTION

Semiconductor-metal hybrid heterostructures are promising building blocks for applications in catalytic, magnetic, and opto-electronic devices. The semiconductor's tunable band gap (300-4,000 nanometers 4.1-0.3 eV), broad and intense absorption ($\epsilon \approx 10^5$-$10^6$ L·mol$^{-1}$·cm$^{-1}$), and long-lived exciton (up to 40 nanoseconds for CdSe, 1.8 microseconds for PbS) provide unmatched light absorption and emission capabilities. Of particular interest are large aspect ratio semiconductors, such as nanorods, due to their ability to generate multiple excitons. The metal can, depending on its nature serve as an additional chromophore, a fluorescence enhancer, a paramagnet, or even as a charge-collecting material where carriers localize after exciton quenching. For example, semiconductor-metal hybrid heterostructures have been shown to convert solar energy into potential and chemical energy. They become redox-active upon illumination and may remain redox-active after being stored in the dark for several hours. In addition, semiconductor and metal nanocrystals tend to display a higher degree of chemical-, photo-, and colloidal-stability (solubility) than other materials such as organic polymers and transition metal complexes.

Many of the documented photochemical deposition methods employ laser irradiation. Unfortunately, laser irradiation invariably occurs over small sample areas or spots, leading to low material yields and thus limiting its synthetic utility. Further, few researchers and even fewer synthetic chemists have direct and reliable access to expensive lasers.

Reliable and selective synthesis for these materials would increase their availability for both fundamental studies and applications. Further, reliable synthetic methods for fabricating semiconductor-metal hybrid heterostructures would increase the availability of these materials for their fundamental study and systematic testing, allowing for the establishment of structure-activity relationships and further facilitating their eventual application.

Embodiments of the invention provide such a method of fabricating semiconductor-metal hybrid heterostructures. These and other advantages of the invention, as well as additional inventive features, will be apparent from the description of the invention provided herein.

BRIEF SUMMARY OF THE INVENTION

In one aspect, embodiments of the invention provide a method of synthesizing colloidal semiconductor-metal hybrid heterostructures is disclosed. The method includes dissolving semiconductor nanorods in a solvent to form a nanorod solution, and adding a precursor solution to the nanorod solution. The precursor solution contains a metal. The method further includes illuminating the combined precursor and nanorod solutions with light of a specific wavelength. The illumination causes the deposition of the metal in the precursor solution onto the surface of the semiconductor nanorods.

In a particular embodiment, each of the semiconductor nanorods has an axially anisotropic morphology, wherein each of the semiconductor nanorods is oblong having a relatively thick first end that tapers to a relatively thin second end. In a further embodiment, the specific wavelength of the light determines on which end a majority of the metal is deposited.

In certain embodiments, the metal in the precursor solution is one of palladium and platinum. The precursor solution may be one of cis-dimethyl(N,N,N',N'-tetramethylenediamine) palladium(II) and dimethyl (1,5-cyclooctadiene) platinum (II). The semiconductor nanorods may comprise cadmium sulfide or cadmium sulphoselenide.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
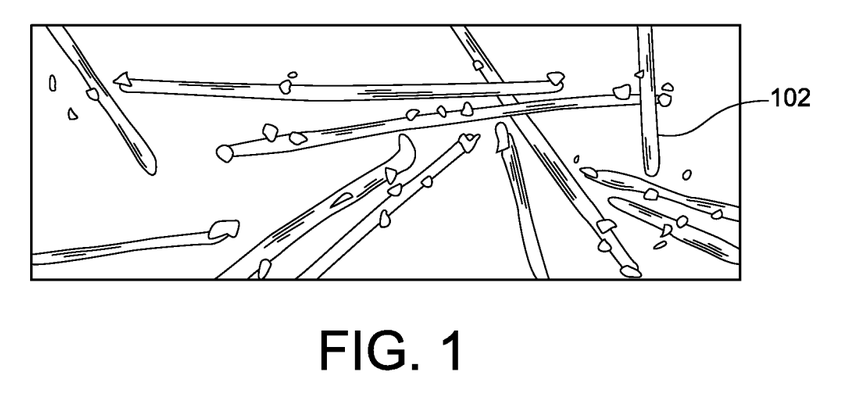
FIG. 1 is an illustration of semiconductor-metal hybrid nano-heterostructures that include cadmium sulfide nanorods.

In an embodiment of the invention, a method for fabricating semiconductor-metal hybrid heterostructures via photochemical deposition is disclosed. As illustrated in FIG. 1, in particular embodiments, cadmium sulfide (CdS) is the semiconductor in these metal hybrid heterostructures. Cadmium sulfide nanorods 102 may be synthesized in a solution as shown in FIG. 1. Typically, these cadmium sulfide nanorods 102 range from approximately 120 nanometers (nm) to 185 nm in length, and from approximately 4.5 nm to 6.5 nm in diameter. In certain embodiments, the cadmium sulfide nanorods 102 have a wurzite crystal structure.

Figure 2:
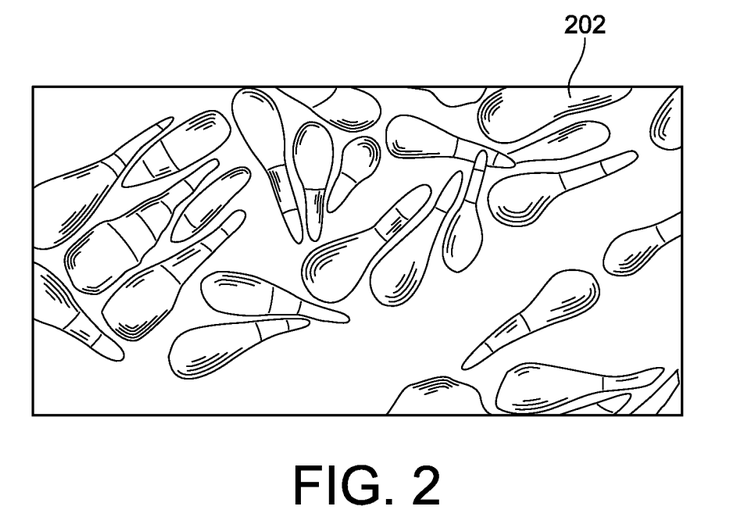
FIG. 2 is a an illustration of hybrid semiconductor-metal hybrid nano-heterostructures with axially anisotropic cadmium sulphoselenide nanorods, constructed in accordance with an embodiment of the invention.

FIG. 2 shows an alternate embodiment of the invention that includes semiconductor nanorods 202 where cadmium sulphoselenide (CdSSe) is the semiconductor. In a particular embodiment, the cadmium sulphoselenide is described by the formula $CdS_{1-x}Se_x$, and in an even more particular example by $CdS_{0.4}Se_{0.6}$. Typically, these cadmium sulphoselenide nanorods 202 have an axially anisotropic morphology, and range from approximately 51 nm to 68 nm in length. These drumstick-shaped nanorods 202 include a relatively thick first end that tapers to a relative thin second end. The thick first end will typically have a diameter ranging from approximately 15 nm to 21 nm, while the thin second end will typically have a diameter ranging from approximately 4.5 nm to 6.5 nm.

One exemplary method for synthesizing cadmium sulphoselenide nanorods involves placing cadmium oxide (CdO), trioctylphosphine oxide (TOPO), and octadecylphosphonic acid (ODPA) into a flask. The mixture is then heated to about 100 degrees Centigrade and evacuated under vacuum for approximately 15 minutes, and then refilled with argon and heated to about 320 degrees Centigrade to form a completely colorless solution. The solution is allowed to cool to 120 degrees Centigrade and evacuated under vacuum for 15 minutes, then refilled with argon and heated back to 320 degrees Centigrade.

When the temperature reaches 300 degrees Centigrade, trioctylphosphine (TOP) is injected into the flask. When the temperature reaches 320 degrees Centigrade, a solution containing an air-free mixture of trioctylphosphine sulfide (TOPS) and trioctylphosphine selenide (TOPSe) is rapidly injected, causing a gradual color change. After injection, the temperature is allowed to settle at 315 degrees Centigrade and kept constant for a total reaction time of approximately 85 minutes. The reaction mixture is then allowed to cool to room temperature. After dilution with toluene, the cadmium sulphoselenide nanorods may be isolated by the addition of an iso-propanol/nonanoic acid mixture, followed by centrifugation. Synthesized in this manner, the cadmium sulphoselenide nanorods may have a wurzite crystal structure.

An exemplary method for synthesizing semiconductor-metal hybrid heterostructures includes dissolving cadmium sulfide nanorods in toluene to give an optical density (OD) of approximately 1.2 at 470 nm. The solution is then degassed, refilled with dry argon, and stored in the dark for about 12 hours. Under a dry atmosphere, dimethyl (1,5-cyclooctadiene) platinum (II) ($CODPtMe_2$) to produce a cadmium sulfide-platinum hybrid, or cis-dimethyl-(N,N,N',N'-tetramethylene-diamine) palladium(II) ($TMEDAPdMe_2$) to produce a cadmium sulfide-palladium hybrid is dissolved in a solvent, such as anhydrous toluene, mixed with triethylamine (used as a terminal electron donor), and added to the cadmium sulfide nanorod solution via syringe, for example. The deposition reaction is then carried out for about 3 hours by one of two routes: (1) thermally in the dark, in an oil bath pre-equilibrated at 80 degrees Centigrade when for the cadmium sulfide-platinum hybrid, or in a room temperature water bath when for the cadmium sulfide-palladium hybrid; or (2) photochemically, under illumination at room temperature in a photoreactor containing a set of fluorescent lamps. In a first exemplary embodiment, the fluorescent lamps provide light at a wavelength of 350 nm, at an intensity of 136 $W/m^2$. In a second exemplary embodiment, the fluorescent lamps provide light at a wavelength of 420 nm, at an intensity of 16.6 $W/m^2$. The nonvolatile products in the solution can be purified by precipitation using a mixture of equal parts acetone and methanol, followed by centrifugation.

An alternative method for synthesizing semiconductor-metal hybrid heterostructures includes dissolving the axially anisotropic $CdS_{1-x}Se_x$ nanorods in a solvent, such as toluene. In a particular embodiment, $CdS_{0.4}Se_{0.6}$ nanorods are dissolved in toluene to give an optical density (OD) of approximately 1.3 at 630 nm. The solution is then degassed, refilled with dry argon, and stored in the dark for about 12 hours. Under a dry atmosphere, cis-dimethyl(N,N,N',N'-tetramethylenediamine) palladium(II) $(TMEDA)PdMe_2$ is dissolved in anhydrous toluene, mixed with triethylamine (used as terminal electron donor), and added to the $CdS_{0.4}Se_{0.6}$ nanorod solution via syringe.

In embodiments of the invention, the photochemical reaction may be carried out for as little as one hour, or as long as three hours under illumination at room temperature, using, for example, a set of fluorescent lamps. Using relatively inexpensive fluorescent lamps, which can simultaneously illuminate large volumes of the solution (as compared to laser irradiation), is less costly and more efficient than traditional laser-based photodeposition. In a first exemplary embodiment, the fluorescent lamps provide light at a wavelength of 350 nm and at an intensity of 136 $W/m^2$. In a second exemplary embodiment, the fluorescent lamps provide light at a wavelength of 420 nm and at an intensity of 16.6 $W/m^2$. In a third exemplary embodiment, the fluorescent lamps provide light at a wavelength of 575 nm and at an intensity of 47.2 $W/m^2$. The nonvolatile products in the solution can be purified by precipitation with methanol, followed by centrifugation.

TABLE 1

Metal Deposition on Colloidal Semiconductor Nanorods

| no. | nanorods | Metal | precursor | wave length | T (° C.) | time (hrs) | particle diam. (nm) | % bound | % free | metal particles |
|---|---|---|---|---|---|---|---|---|---|---|
| 1 | CdS | Pt | $CODPtMe_2$ | dark | 80 | 3 | 1.9 ± 0.6 | 30 | 70 | 1.1 ± 0.9 |
| 2 | CdS | Pt | $CODPtMe_2$ | 350 nm | 24 | 3 | 2.6 ± 0.8 | 80 | 20 | 1.6 ± 1.3 |
| 3 | CdS | Pt | $CODPtMe_2$ | 420 nm | 24 | 3 | 3.1 ± 1.4 | 95 | 5 | 1.4 ± 0.9 |
| 4 | None | Pt | $CODPtMe_2$ | 420 nm | 24 | 3 | 2.9 ± 1.2 | — | — | — |
| 5 | CdS | Pd | $TMEDA-PdMe_2$ | 420 nm | 24 | 3 | 7.2 ± 1.7 | 90 | 10 | 5.6 ± 2.2 |

TABLE 1-continued

Metal Deposition on Colloidal Semiconductor Nanorods

| no. | nanorods | Metal | precursor | wave length | T (° C.) | time (hrs) | particle diam. (nm) | % bound | % free | metal particles |
|---|---|---|---|---|---|---|---|---|---|---|
| 6 | CdS | Pd | TMEDA-PdMe$_2$ | dark | 24 | 3 | 4.1 ± 0.7 | 6 | 94 | 2.1 ± 0.7 |
| 7 | CdS$_{0.4}$Se$_{0.6}$ | Pd | TMEDA-PdMe$_2$ | 350 nm | 24 | 1 | 2.6 ± 0.8 | 37 | 63 | 1.5 ± 1.1 |
| 8 | CdS$_{0.4}$Se$_{0.6}$ | Pd | TMEDA-PdMe$_2$ | 420 nm | 24 | 1 | 4.9 ± 2.2 | 48 | 52 | 2.1 ± 1.5 |
| 9 | CdS$_{0.4}$Se$_{0.6}$ | Pd | TMEDA-PdMe$_2$ | 575 nm | 24 | 1 | 5.0 ± 1.5 | 90 | 10 | 1.3 ± 0.8 |
| 10 | CdS$_{0.4}$Se$_{0.6}$ | Pd | TMEDA-PdMe$_2$ | 575 nm | 24 | 3 | 5.1 ± 1.4 | 92 | 8 | 8.0 ± 2.0 |

All reactions were carried out using a 2 mL nanorod solution in toluene of OD$_{470\,nm}$ = 1.2(CdS) or OD$_{630\,nm}$ = 1.3(CdS$_{0.4}$Se$_{0.6}$), 28-30 mg metal precursor, 0.5 mL NEt$_3$ as electron donor, and 1 mL toluene.

One method for depositing platinum onto cadmium sulfide nanorods involves using thermal deposition. In a particular embodiment, thermal deposition is performed at 80 degrees Centigrade in the complete absence of light. Thermal deposition in the dark results in the formation of small platinum particles, typically with a diameter of 1.9 nm±0.6 nm. Generally, the majority of the thermally deposited platinum particles (i.e., about 70%) are freestanding, unattached to the cadmium sulfide nanorods. Only a small fraction of platinum particles (i.e., about 30%) are bound to the surface of cadmium sulfide nanorods (See Table 1, entry 1). Among surface-bound particles, there is an average of 1.1±0.9 platinum particles per cadmium sulfide nanorod, with a maximum of three platinum particles per cadmium sulfide nanorod. The fact that freestanding platinum particles form thermally from the direct reaction between CODPtMe$_2$ and triethylamine indicates that platinum particles can form independently from cadmium sulfide and that preformed platinum particles do not tend to associate with cadmium sulfide nanorods after they have already formed.

In an alternate embodiment, platinum may be deposited onto cadmium sulfide nanorods using photodeposition. By illuminating the solution containing the cadmium sulfide nanorods with light from a 350 nm fluorescent lamp at room temperature, platinum particles with a diameter of 2.6±0.8 nm are generally formed within the solution. A significant fraction of platinum particles (e.g., about 20%) formed under this 350 nm illumination are likely to be freestanding, i.e., remain unassociated with the cadmium sulfide nanorods (see Table 1, entry 2). However, a larger fraction of platinum particles (e.g., about 80%) are likely to be bound to the surface of the cadmium sulfide nanorods. Among surface-bound particles, there is an average of 1.6±1.3 platinum particles per cadmium sulfide nanorod, although there may be as many as three, four, or six platinum particles per cadmium sulfide nanorod.

Similarly, photodeposition of platinum onto cadmium sulfide nanorods under illumination from a 420 nm fluorescent lamp at room temperature typically results in the formation of platinum particles with a diameter of 3.1±1.4 nm. In this case, only a marginal number of platinum particles (e.g., about 5%) are likely to be freestanding (see Table 1, entry 3). The majority of platinum particles (e.g., about 95%) formed under 420 nm illumination are likely to be bound to the surface of cadmium sulfide nanorods. Typically, among surface-bound particles, there is an average of 1.4±0.9 platinum particles per cadmium sulfide nanorod, though there could be as many as three platinum particles per cadmium sulfide nanorod.

In the absence of the cadmium sulfide nanorods, the reaction between CODPtMe$_2$ and triethylamine under 350 nm illumination at room temperature generally results in the formation of platinum particles with a diameter of 2.9±1.2 (see Table 1, entry 4). The fact that platinum particles form by direct reaction between CODPtMe2 and triethylamine under 350 nm illumination confirms that photochemical formation of freestanding platinum particles can occur independently from the cadmium sulfide nanorods. Thus, cadmium sulfide nanorods need not act as "sensitizers" for the decomposition of the organometallic precursor.

Figure 3:
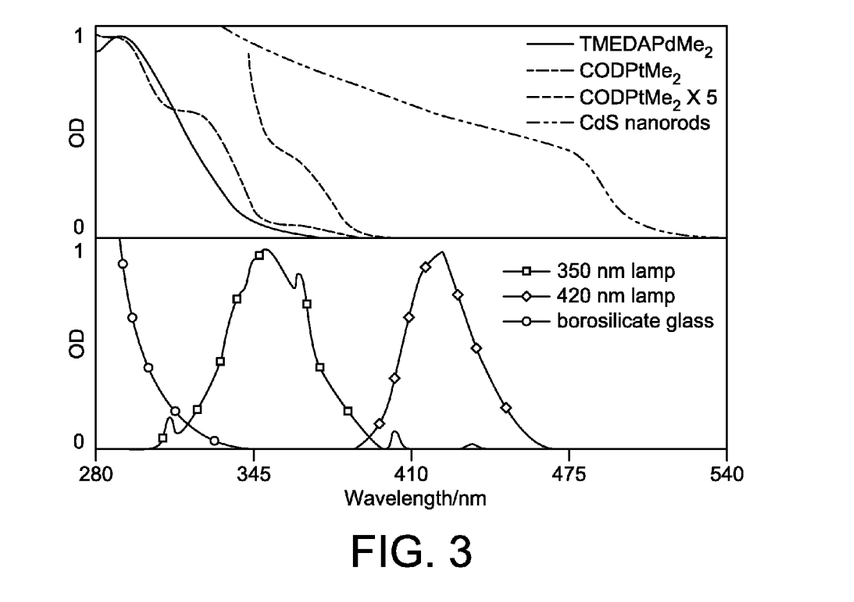
FIG. 3 is a graphical illustration showing the relationship between optical density and illumination wavelength for a semiconductor and several precursor solutions.

It has been determined that there may be multiple parallel pathways for the formation of platinum nanoparticles. As shown in the top half of the graphical illustration of FIG. 3, cadmium sulfide nanorods have an absorption band-edge at 500 nm and continue to absorb more strongly at shorter wavelengths. The CODPtMe$_2$ precursor is colorless and does not absorb in the visible region but has three distinct bands in the ultraviolet region: 285, 320, and 360 nm. Comparing these spectral features to the irradiance profiles shown in the bottom half of FIG. 3 of the two lamps used, both cadmium sulfide nanorods and CODPtMe$_2$ can absorb light emitted by the 350 nm lamp. In contrast, only cadmium sulfide nanorods, not CODPtMe$_2$, can absorb light emitted by the 420 nm lamp.

Figure 4:
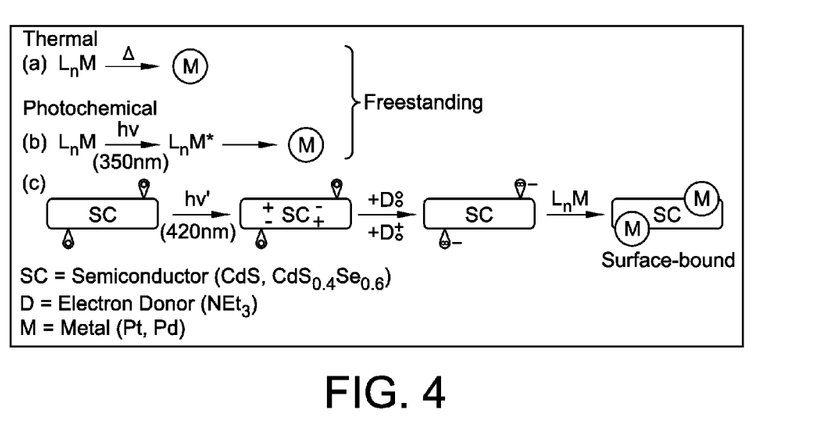
FIG. 4 is a diagram illustrating the nucleation of metal particles in a precursor solution.

FIG. 4 illustrates the nucleation, both thermally and photochemically, of metal particles in a precursor solution. When the organometallic precursor CODPtMe$_2$ is heated in the dark, it decomposes thermally and nucleates into freestanding (unbound) platinum particles anywhere in solution. Under photochemical conditions using a 350 nm fluorescent lamp, direct absorption by (and excitation of) the CODPtMe$_2$ in the presence of triethylamine results in photoinduced reduction and nucleation, wherein 15% of the platinum particles generated are freestanding (unbound) anywhere in solution. Together, these thermal and photochemical homogeneous nucleation pathways are responsible for the formation of freestanding platinum nanoparticles independently of the semiconductor surface.

Alternatively, under photochemical conditions, when absorption (and excitation) occurs through the cadmium sulfide nanorods, a third pathway occurs where electron-hole pairs (excitons) are formed on the semiconductor followed by migration of electrons to surface trap states (i.e., dangling bonds) on the semiconductor surface. The surface localized electrons can act as seeding points for the binding and reduction of CODPtMe$_2$ into platinum nuclei. This heterogeneous nucleation mechanism is responsible for the formation of bound platinum nanoparticles on the surface of cadmium sulfide nanorods. Apparently the growth of platinum nanoparticles in this fashion from platinum nuclei is fast and irreversible. However, this preference may vary depending on the chemical composition of the semiconductor surface (e.g., cadmium-rich versus sulfur-rich, ligand type, and surface coverage, etc.).

The deposition of palladium onto cadmium sulfide nanorods was carried out using the molecular precursor cis-dimethyl(N,N,N0,N0-tetramethylenediamine)-palladium (II), TMEDAPdMe$_2$. In this case, the palladium particles generally form with an average diameter of 7.2±1.7 nm, the majority of which (e.g., about 90%) are bound to the cadmium sulfide surface, and only a few (e.g., about 10%) are freestanding (see Table 1, entry 5). Among surface-bound particles, there is an average of 5.6±2.2 palladium particles per cadmium sulfide nanorod and may be as many as 11 palladium particles per cadmium sulfide nanorod.

Conversely, thermal deposition of palladium on cadmium sulfide nanorods at room temperature in the complete absence of light generally results in the formation of palladium particles with a diameter of 4.1±0.7 nm. The majority of the thermally deposited palladium particles (e.g., about 94%) are likely to be freestanding, and only a very few (e.g., about 6%) are likely to be bound to the surface of cadmium sulfide nanorods (see Table 1, entry 6). Among surface-bound particles, there is typically an average of 2.1±0.7 palladium particles per cadmium sulfide nanorod, though there may be as many as four palladium particles per cadmium sulfide nanorod.

In particular embodiments of the invention, palladium deposition onto axially anisotropic cadmium sulphoselenide nanorods 202 (shown in FIG. 2) may be accomplished via photodeposition. Palladium is deposited onto axially anisotropic CdS$_{0.4}$Se$_{0.6}$ nanorods 202 using TMEDAPdMe$_2$ as the precursor. As can be seen in FIGS. 5A-5F, these CdS$_{0.4}$Se$_{0.6}$ nanorods 202 have a graded-alloy composition between a thick CdSe-rich head 402 on one end and a thin CdS-rich tail 404 on the other end. The illumination energy (lamp wavelength) and time illuminated both have a strong effect on the diameter, loading, and specific locale of the palladium particles 406 deposited. Additionally, the distribution of palladium particles 406 along the length of the axially anisotropic CdS$_{0.4}$Se$_{0.6}$ nanorods 202 can vary significantly depending on the specific lamp used.

Figure 5A:
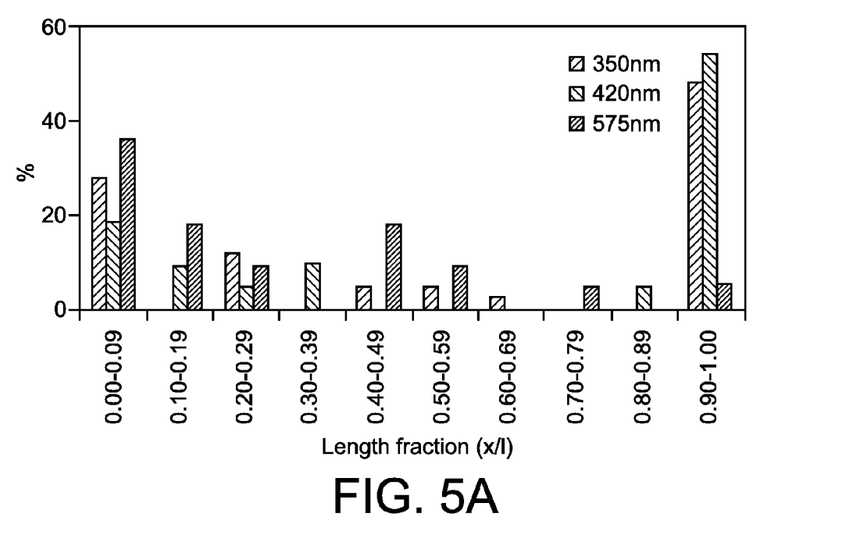
FIGS. 5A-5F are graphical illustrations showing the relationship between illumination wavelength and particle formation, particle location, and particle size for a semiconductor-metal hybrid nano-heterostructure constructed in accordance with an embodiment of the invention.
Figure 5B:
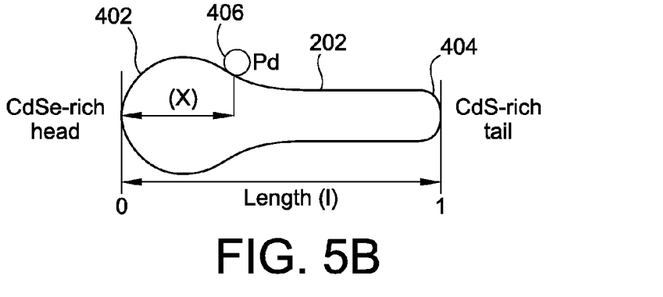
Figure 5C:
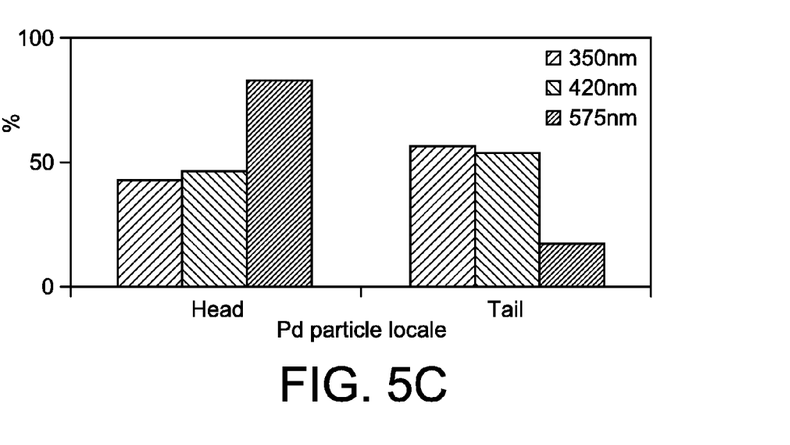
Figure 5D:
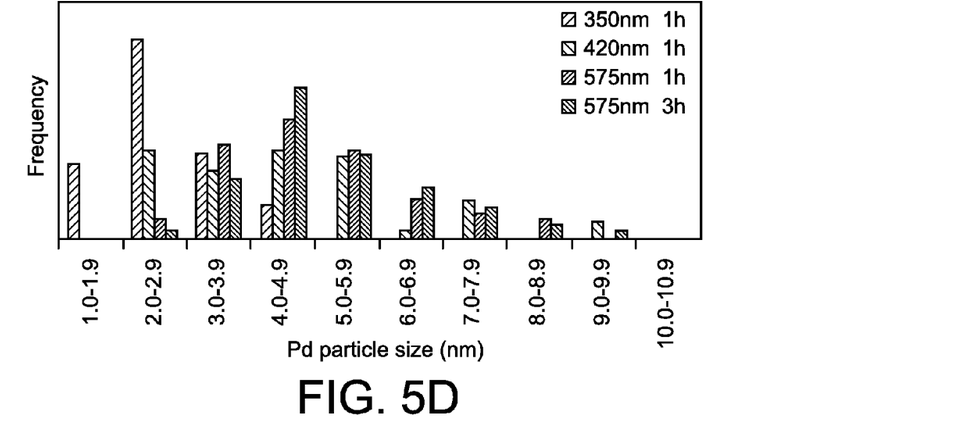

Referring to FIG. 5D, it can be seen that photodeposition of palladium onto CdS$_{0.4}$Se$_{0.6}$ nanorods 202 for about one hour at room temperature generally results in 2.6±0.8 nm diameter palladium particles 406 with an average of 1.5±1.1, though there may be as many as five, palladium particles 406 per nanorod 202 when using a 350 nm lamp. When using a 420 nm lamp, one-hour photodeposition of palladium onto CdS$_{0.4}$Se$_{0.6}$ nanorods typically results in palladium particles 406 with a diameter of 4.9±2.2 nm, and with an average of 2.1±1.5, though there may be as many as six, palladium particles 406 per nanorod 202. When using a 575 nm lamp, one-hour photodeposition of palladium onto CdS$_{0.4}$Se$_{0.6}$ nanorods 202 typically results in palladium particles 406 with a diameter of 5.0±1.5 nm, and with an average of 1.3±0.8, though there may be as many as three, palladium particles 406 per nanorod 202 (see Table 1, entries 7-9). Further, photodeposition for three hours at room temperature typically results in 5.1±1.4 nm diameter palladium particles 406 with an average of 8.0±2.0, though there may be as many as 15, palladium particles 406 per nanorod 202 when using a 575 nm lamp (see Table 1, entry 10).

As can be inferred from Table 1, it appears that the palladium particle diameter may increase with increasing lamp wavelength for a given photodeposition time. In contrast, the palladium particle diameter remains fairly constant for different photodeposition times, while keeping the wavelength constant: 5.0±1.5 nm (575 nm for one hour); 5.1±1.4 nm (575 nm for three hours) (see Table 1, entries 9-10).

Figure 5E:
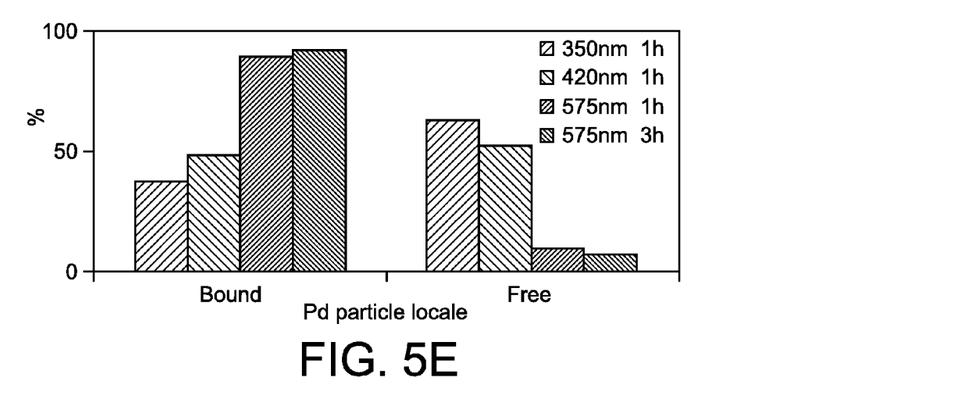

Referring to FIG. 5E, and also to Table 1, it can be seen that the fraction of surface-bound palladium particles 406 increases with increasing lamp wavelength: 350 nm for one hour (37% surface-bound); 420 nm for one hour (48% surface-bound); and 575 nm for one hour (80% surface-bound) (Table 1, entries 7-9). Further, the fraction of surface-bound palladium particles 406 remains mostly unchanged with increasing photodeposition time for a given wavelength: 575 nm for one hour (90% surface-bound); 575 nm for three hours (92% surface-bound) (Table 1, entries 9-10).

Figure 5F:
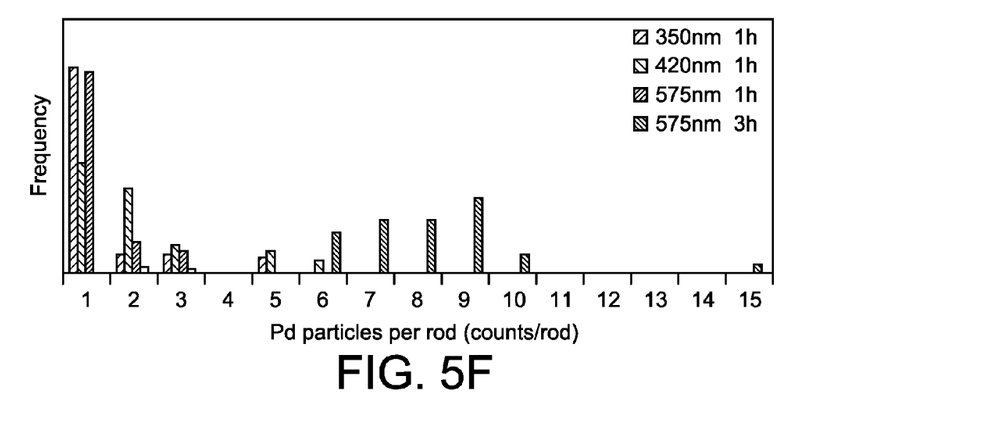

Also, as shown in the graphical illustration of FIG. 5F, palladium loading (number of palladium particles 406 per CdS$_{0.4}$Se$_{0.6}$ nanorod 202) remains approximately the same for different wavelengths, while keeping the photodeposition time constant: 1.5±1.1 palladium particles 406 per nanorod 202 (350 nm for one hour); 2.1±1.5 palladium particles per nanorod (420 nm for one hour); 1.3±0.8 palladium particles 406 per nanorod 202 (575 nm for one hour) (Table 1, entries 7-9). Nonetheless, palladium loading tends to increase with increasing photodeposition times while keeping the wavelength constant: 1.3±0.8 palladium particles 406 per nanorod 202 (575 nm for one hour); 8.0±2.0 palladium particles 406 per nanorod 202 (575 nm for three hours) (Table 1, entries 9-10). This constitutes a six-fold increase in palladium loading with tripling of the photodeposition time.

Particular embodiments of the invention include methods for site-selective metal photodeposition onto semiconductor nanorods. As explained above, CdS$_{0.4}$Se$_{0.6}$ nanorods 202 may have an axially anisotropic morphology, where the nanorod 202 has a relatively thick first end 402, or head, that tapers to a relatively thin second end 404, or tail. The locale and distribution of palladium particles 406 on the axially anisotropic CdS$_{0.4}$Se$_{0.6}$ nanorods 202 is influenced by the wavelength of light used during photodeposition. More specifically, the photodeposited palladium particles 406 preferentially accumulated toward one end or the other end of the axially anisotropic CdS$_{0.4}$Se$_{0.6}$ nanorods 202 depending on the specific lamp wavelength used.

Referring to FIG. 5A, we see that when photodeposition is carried out using 350 and 420 nm lamps, for example, a large fraction of the surface-bound palladium particles 406 (e.g., >50%) are located at or very near the tip of the thin CdS-rich tail 404 of the CdS$_{0.4}$Se$_{0.6}$ nanorods 202. In contrast, when photodeposition is carried out with the 575 nm lamp, most of the surface-bound palladium particles (approximately 83%) are located on the thick CdSe-rich head 402 segment of the CdS$_{0.4}$Se$_{0.6}$ nanorods 202. When photodeposition is carried out using 350 and 420 nm lamps, approximately 57% and 55%, respectively, of the surface-bound palladium particles 406 are located on the thinner CdS-rich tail 404 segment of the nanorod 202. When photodeposition is carried out using the 575 nm lamp, approximately 83% of the surface-bound palladium particles 406 are located on the thicker CdSe-rich head 402 segment.

Thus, by switching the illumination energy to shorter or longer wavelengths while keeping all other experimental conditions constant (e.g., precursors, concentrations, temperature), the palladium particles 406 can be controllably and site-selectively photodeposited on either side of axially anisotropic CdS$_{0.4}$Se$_{0.6}$ nanorods 202. The CdSe-rich head 402 of the nanorod directly absorbs light emitted by all three 350, 420, and 575 nm lamps, allowing palladium particles 406 to deposit on the head 402 surface when the nanorods 202 are illuminated with any of these wavelengths. In contrast, the CdS-rich tail 404 of the nanorod 202 only absorbs light emitted by the 350 and 420 nm lamps, but not light emitted by the 575 nm lamp, allowing palladium particles 406 to deposit on the tail 404 surface with the 350 and 420 nm lamps but not with the 575 nm lamp. The lower energy excitons produced with the 575 nm lamp appear to be localized on the head 402 of the nanorods 202, and exciton trapping by surface defects must be rapid, given the strong effect the 575 nm lamp has in skewing the distribution of surface bound palladium particles 406 toward the head 402 of the nanorods 202. However, excitons appear able to travel relatively freely and uninterrupted across the whole length of the nanorod 202.

Palladium particles 406 can be found along the length of the nanorod 202 from the head 402 segment to the tail 404 segment of the nanorods 202 with all the lamps, including the CdS-rich tail 404 of the nanorods 202 when using the 575 nm lamp. Among other factors that could affect metal deposition are the relative lamp intensities and relative nanorod absorption coefficients at each lamp wavelength. Lamp intensities determine the "power" or availability of photons and are independent of lamp wavelengths. Relative absorption coefficients determine how many photons are absorbed at each wavelength. Thus, light absorption and the efficiency of exciton generation with the 350 nm lamp may be higher than with the 420 or 575 nm lamps.

Additionally, at the individual particle level, relative absorption coefficients between different nanorod segments could play an important role. For example, both CdS-rich tail 404 and CdSe-rich head 402 segments absorb light emitted by 350 and 420 nm lamps with similar absorption coefficients. Surface defects also appear to play a role in determining the exact locale of metal deposition. Moreover, the diameter of CdS-rich tail 404 segments (5.6±0.8 nm) is significantly thinner than the diameter of CdSe-rich head 402 segments (17.8±2.4 nm). Thinner nanorods 202 have larger surface-to-volume ratios as well as a sharper curvature and an increased surface energy. Assuming that both segments are equally passivated, one would expect thin CdS-rich tail 404 to contain a larger concentration of surface defects. As a result, a larger fraction of palladium particles 406 form on the CdS-rich tail 404 segment when using 350 nm and 420 nm lamps, and palladium particles 406 tend to form at the tip of the CdS-rich tail 404 where curvature is the sharpest.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of synthesizing colloidal semiconductor-metal hybrid heterostructures, the method comprising:
   dissolving semiconductor nanorods in a solvent to form a nanorod solution;
   adding a precursor solution to the nanorod solution, the precursor solution containing a metal;
   illuminating the combined precursor and nanorod solutions with non-laser light of a specific wavelength, the illumination causing deposition of the metal in the precursor solution onto a surface of the semiconductor nanorods.

2. The method of claim 1, wherein each of the semiconductor nanorods has an axially anisotropic morphology.

3. The method of claim 2, wherein each of the semiconductor nanorods is oblong having a relatively thick first end that tapers to a relatively thin second end.

4. The method of claim 3, wherein the specific wavelength of the non-laser light determines on which end a majority of the metal is deposited.

5. The method of claim 4, wherein the specific wavelength of the non-laser light ranges from 350 nanometers to 575 nanometers.

6. The method of claim 1, wherein the metal comprises palladium.

7. The method of claim 6 wherein the precursor solution comprises cis-dimethyl (N,N,N',N'-tetramethylenediamine) palladium(II).

8. The method of claim 1, wherein the metal comprises platinum.

9. The method of claim 8 wherein the precursor solution comprises dimethyl (1,5-cyclooctadiene) platinum (II).

10. The method of claim 1, wherein the semiconductor nanorods comprise cadmium sulfide nanorods.

11. The method of claim 10, wherein the cadmium sulfide nanorods have a wurzite crystal structure.

12. The method of claim 1, wherein the solvent is toluene.

13. The method of claim 1, wherein the nanorod solution has an optical density of approximately 1.2 at 470 nm or approximately 1.3 at 630 nm.

14. The method of claim 1, wherein illuminating the combined precursor and nanorod solutions with non-laser light of a specific wavelength comprises illuminating the combined precursor and nanorod solutions with non-laser light of a specific wavelength for one to three hours.

15. The method of claim 1, wherein illuminating the combined precursor and nanorod solutions with non-laser light of a specific wavelength comprises illuminating the combined precursor and nanorod solutions with non-laser light of a specific wavelength using fluorescent lamps.

16. The method of claim 1, further comprising synthesizing the semiconductor nanorods to be dissolved.

17. The method of claim 16, wherein synthesizing the semiconductor nanorods comprises:
- mixing cadmium oxide, trioctylphosphine oxide, and octadecylphosphonic acid to form a mixture;
- heating the mixture;
- adding trioctylphosphine to the mixture, and then adding trioctylphosphine sulfide and trioctylphosphine selenide to the mixture;
- diluting the mixture in a solvent; and
- isolating cadmium sulphoselenide nanorods from the mixture.

\* \* \* \* \*